US008564185B2

(12) United States Patent
Ott et al.

(10) Patent No.: US 8,564,185 B2
(45) Date of Patent: Oct. 22, 2013

(54) SEMICONDUCTOR LIGHT SOURCE HAVING A PRIMARY RADIATION SOURCE AND A LUMINESCENCE CONVERSION ELEMENT

(75) Inventors: Hubert Ott, Bad Abbach (DE); Alfred Lell, Maxhutte-Haidhof (DE); Sönke Tautz, Tegernheim (DE); Uwe Strauss, Bad Abbach (DE); Frank Baumann, Regensburg (DE); Kirstin Petersen, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 12/680,626

(22) PCT Filed: Sep. 11, 2008

(86) PCT No.: PCT/DE2008/001529
§ 371 (c)(1),
(2), (4) Date: Aug. 16, 2010

(87) PCT Pub. No.: WO2009/039827
PCT Pub. Date: Apr. 2, 2009

(65) Prior Publication Data
US 2010/0295438 A1 Nov. 25, 2010

(30) Foreign Application Priority Data

Sep. 28, 2007 (DE) .......................... 10 2007 046 608
Mar. 3, 2008 (DE) .......................... 10 2008 012 316

(51) Int. Cl.
*H05B 33/00* (2006.01)
(52) U.S. Cl.
USPC .......................................... 313/501; 313/498

(58) Field of Classification Search
USPC ............ 313/498–512; 315/169.3; 345/36, 45, 345/76
See application file for complete search history.

(56) References Cited

U.S. PATENT DOCUMENTS

| 5,813,752 | A | 9/1998 | Singer et al. |
| 6,066,861 | A | 5/2000 | Höhn et al. |

(Continued)

FOREIGN PATENT DOCUMENTS

| CN | 1880833 A | 12/2006 |
| CN | 1885581 A | 12/2006 |

(Continued)

*Primary Examiner* — Nimeshkumar Patel
*Assistant Examiner* — Christopher Raabe
(74) *Attorney, Agent, or Firm* — Cozen O'Connor

(57) ABSTRACT

A semiconductor light source is provided, the semiconductor light source having a primary radiation source (1) which, when the semiconductor light source is operated, emits electromagnetic primary radiation (5) in a first wavelength range, and having a luminescence conversion module (2) into which primary radiation (5) emitted by the primary radiation source (1) is fed. The luminescence conversion module (2) contains a luminescence conversion element (6) which, by means of a luminescent material, absorbs primary radiation (5) from the first wavelength range and emits electromagnetic secondary radiation (15) in a second wavelength range. The luminescence conversion element (6) is arranged on a heat sink (3) at a distance from the primary radiation source (1). It has a reflector surface (7, 71, 72) which reflects back into the luminescence conversion element (6) primary radiation (5) which passes through the luminescence conversion element (6) and is not absorbed thereby and/or reflects secondary radiation (15) in the direction of a light coupling-out surface (601) of the luminescence conversion element (6).

14 Claims, 5 Drawing Sheets

(56) References Cited

U.S. PATENT DOCUMENTS

| | | | |
|---|---|---|---|
| 6,504,179 B1 | 1/2003 | Ellens et al. | |
| 7,040,774 B2 * | 5/2006 | Beeson et al. | 362/84 |
| 7,497,581 B2 * | 3/2009 | Beeson et al. | 362/84 |
| 7,781,958 B2 * | 8/2010 | Hattori et al. | 313/501 |
| 2002/0027231 A1 | 3/2002 | Okada et al. | |
| 2003/0002272 A1 * | 1/2003 | Suehiro et al. | 362/84 |
| 2003/0218180 A1 | 11/2003 | Fujiwara | |
| 2004/0145913 A1 | 7/2004 | Ouderkirk et al. | |
| 2004/0233664 A1 * | 11/2004 | Beeson et al. | 362/231 |
| 2005/0006659 A1 | 1/2005 | Ng et al. | |
| 2005/0116635 A1 | 6/2005 | Walson et al. | |
| 2005/0270775 A1 | 12/2005 | Harbers et al. | |
| 2006/0202105 A1 | 9/2006 | Krames et al. | |
| 2006/0203468 A1 * | 9/2006 | Beeson et al. | 362/84 |
| 2006/0279950 A1 | 12/2006 | Hama et al. | |
| 2006/0291246 A1 | 12/2006 | Hattori et al. | |
| 2007/0131954 A1 | 6/2007 | Murayama et al. | |
| 2008/0068842 A1 | 3/2008 | Dekker et al. | |
| 2008/0169752 A1 * | 7/2008 | Hattori et al. | 313/503 |
| 2009/0296018 A1 | 12/2009 | Härle et al. | |

FOREIGN PATENT DOCUMENTS

| | | |
|---|---|---|
| CN | 1902519 A | 1/2007 |
| DE | 201 08 013 | 9/2001 |
| DE | 10 2006 029 203 | 12/2007 |
| DE | 10 2006 029 204 | 1/2008 |
| EP | 1 605 199 | 12/2005 |
| EP | 1 734 302 | 12/2006 |
| JP | 09-34371 | 2/1997 |
| JP | 11-307873 | 11/1999 |
| JP | 2000-515689 | 11/2000 |
| JP | 2001-319984 | 11/2001 |
| JP | 2002-141559 | 5/2002 |
| JP | 2004-071357 | 3/2004 |
| JP | 2004-253592 | 9/2004 |
| JP | 2005-033211 | 2/2005 |
| JP | 2005-294185 | 10/2005 |
| JP | 2005 294185 | 10/2005 |
| JP | 2005-294288 | 10/2005 |
| JP | 2005-347263 | 12/2005 |
| JP | 2006-179658 | 7/2006 |
| JP | 2006-278567 | 10/2006 |
| JP | 2006-352085 | 12/2006 |
| JP | 2007-005522 | 1/2007 |
| JP | 2007-207615 | 8/2007 |
| JP | 2007 207615 | 8/2007 |
| JP | 2008-518434 | 5/2008 |
| JP | 2008-539576 | 11/2008 |
| WO | WO 98/12757 | 3/1998 |
| WO | WO 99/52341 | 10/1999 |
| WO | WO 01/40702 | 6/2001 |
| WO | WO 2007/146863 | 12/2007 |
| WO | WO 2008/000208 | 1/2008 |
| WO | WO 2008/000222 | 1/2008 |
| WO | WO 2008/018002 | 2/2008 |

* cited by examiner

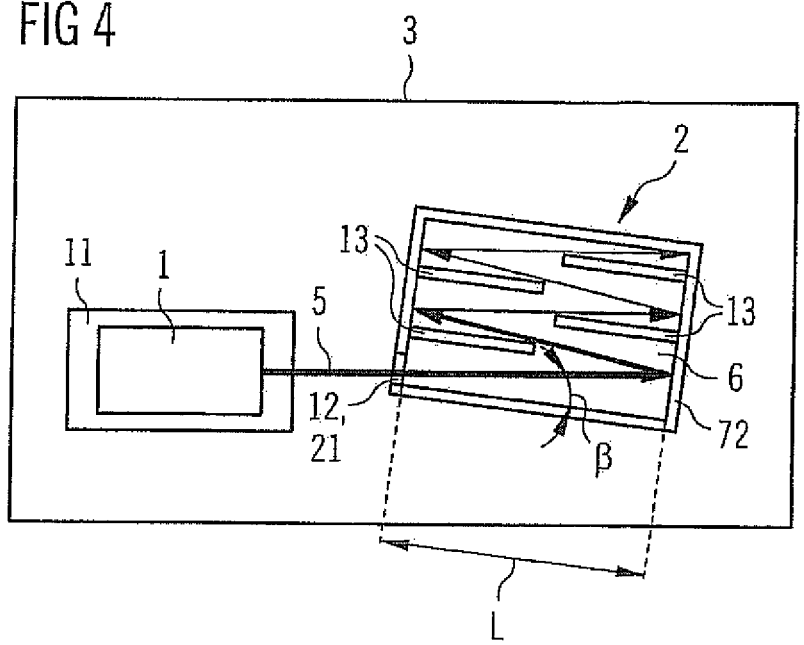
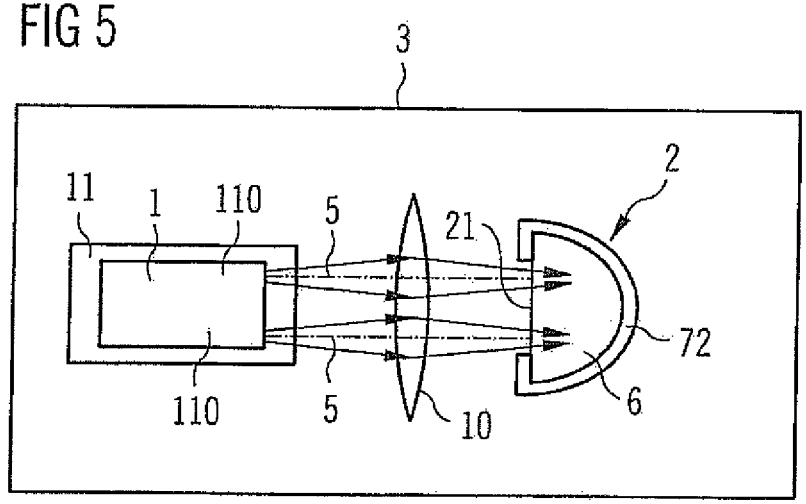

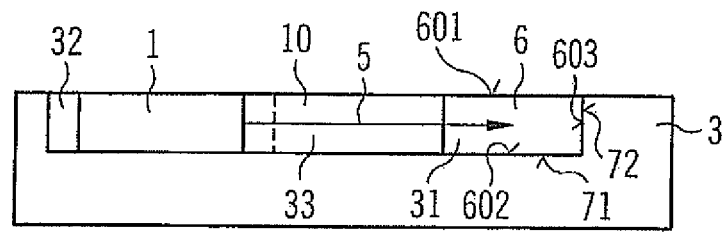
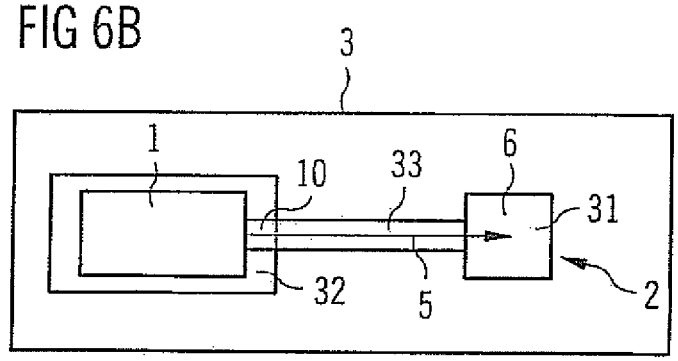
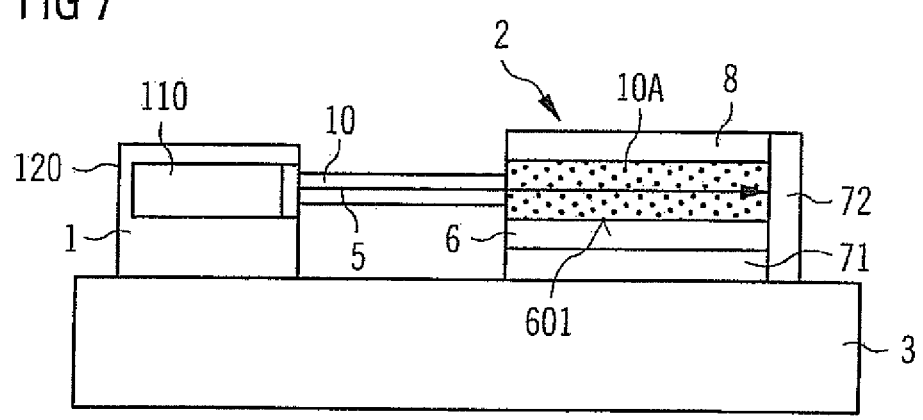

SEMICONDUCTOR LIGHT SOURCE HAVING A PRIMARY RADIATION SOURCE AND A LUMINESCENCE CONVERSION ELEMENT

RELATED APPLICATIONS

This is a U.S. national stage of application No. PCT/DE2008/001529, filed on Sep. 11, 2008.

This patent application claims priority from German patent applications 10 2007 046 608.2 filed Sep. 28, 2007 and 10 2008 012 316.1 filed Mar. 3, 2008, the disclosure content of both of which is hereby incorporated by reference.

FIELD OF THE INVENTION

The present application relates to a semiconductor light source having a primary radiation source and a luminescence conversion element.

BACKGROUND OF THE INVENTION

A semiconductor light source having a primary radiation source and a luminescence conversion element is known for example from the document U.S. Pat. No. 6,066,861. In semiconductor light sources of this kind, the dissipation of heat emitted by the luminescence conversion element is often unsatisfactory. In these semiconductor light sources, irradiation of the luminescence conversion element by the primary radiation source at a high energy density thus typically results in a relatively pronounced increase in temperature in the luminescence conversion element, as a result of which the efficiency of the wavelength conversion of the luminescence conversion element is impaired.

The document EP 1 734 302 A1 discloses a semiconductor light source in which a luminescence conversion element is provided with a heat conduction member.

SUMMARY OF THE INVENTION

It is an object of the present application to provide a semiconductor light source having a primary radiation source and a luminescence conversion module in which the wavelength conversion by the luminescence conversion element is particularly efficient—in particular with high energy densities of the primary radiation emitted by the primary radiation source.

A semiconductor light source is provided which has a primary radiation source which, when the semiconductor light source is operated, emits electromagnetic primary radiation. In particular, the primary radiation source contains an optoelectronic semiconductor chip provided for emission of the primary radiation. In a further development, the optoelectronic semiconductor chip is contained in an optoelectronic semiconductor component. For example, it is arranged in a housing of the semiconductor component. In an advantageous embodiment, the optoelectronic semiconductor chip or semiconductor component is a light-emitting diode or laser diode. In one embodiment, the primary radiation source has a light-emitting diode or laser diode which, when it is operated, emits primary radiation in the blue and/or ultraviolet spectral range. For example, it has a UV light-emitting diode.

The semiconductor light source further has a luminescence conversion module into which at least some of the primary radiation emitted by the primary radiation source is fed.

Preferably, the majority, in particular virtually all, of the primary radiation emitted by the primary radiation source is fed into the luminescence conversion module.

The luminescence conversion module contains a luminescence conversion element which, by means of at least one luminescent material, for example an inorganic luminescent material, converts the wavelength of primary radiation into electromagnetic secondary radiation. In particular, the luminescence conversion element absorbs primary radiation and is thus excited—for example by means of fluorescence or phosphorescence—such that it emits secondary radiation.

For example, the primary radiation contains electromagnetic radiation from a first wavelength range, and the secondary radiation contains electromagnetic radiation from a second wavelength range which is different from the first wavelength range. To put it another way, the first and the second wavelength ranges do not overlap or do so only partially.

The luminescence conversion module is located at a distance from the primary radiation source and is arranged on a heat sink. Expediently, the luminescence conversion element is thermally conductively connected to the heat sink. In one embodiment, the heat sink forms a carrier for the luminescence conversion module.

Advantageously, the heat sink forms a means of removing the loss heat that is generated by the conversion from primary radiation to secondary radiation. For example, the heat sink is a metallic heat sink on which the luminescence conversion module is attached or formed. For example, the heat sink has a metal plate.

Advantageously, as a result of the arrangement of the luminescence conversion module on the heat sink at a distance from the primary radiation source, the temperature of the luminescent material in the luminescence conversion element rises by a particularly small extent when it is irradiated with the primary radiation. Typically, an increase in the temperature of the luminescent material results in a reduction in the efficiency with which the luminescent material converts the wavelength of the primary radiation into secondary radiation. The semiconductor light source is thus advantageously particularly efficient.

In a further development, the heat sink is provided with projections, in particular on a side remote from the luminescence conversion module. In another further development, the heat sink has an active cooling device. For example, the heat sink is a micro-channel cooling system and/or has a Peltier element. In this way, the removal of heat from the luminescence conversion element is advantageously further improved.

In one embodiment of the semiconductor light source, the primary radiation source is provided with a separate heat sink. In this way, cooling of the luminescence conversion module is independent of cooling of the primary radiation source.

In another embodiment, the primary radiation source and the luminescence conversion module are arranged on the same heat sink, and are thus in particular mechanically attached and thermally conductively connected to the heat sink. By means of a common heat sink for the primary radiation source and the luminescence conversion module, a particularly compact overall size for the semiconductor light source is advantageously achieved.

In a preferred embodiment, the luminescence conversion module has a reflector surface which reflects back into the luminescence conversion element, for example, primary radiation which passes through the luminescence conversion element and is not absorbed thereby. Thus, advantageously a particularly large proportion of the wavelength of the primary radiation in the luminescence conversion module is converted into secondary radiation.

As an alternative or in addition, the reflector surface may be provided for reflecting secondary radiation in the direction of a light coupling-out surface of the luminescence conversion module. In this way, a particularly high luminous density is advantageously achieved. The luminescence conversion module has thus a particularly high efficiency.

In a preferred further development, a reflector layer which contains the reflector surface or at least a first partial region of the reflector surface is applied to a surface of the luminescence conversion element facing the heat sink, or to a surface of the heat sink facing the luminescence conversion element. The reflector layer has preferably a layer thickness of less than or equal to 1 µm, preferably less than or equal to 500 nm, particularly preferably less than or equal to 100 nm. Advantageously, a good thermally conductive connection between the luminescence conversion element and the heat sink is achieved by means of a reflector layer of this kind.

The reflector layer contains for example at least one metallic layer and/or at least one dielectric layer. For example, it contains a sequence of layers comprising at least two such layers, that is in particular a sequence of layers comprising one metallic layer and one dielectric layer. In one embodiment, the reflector layer contains a dielectric layer which is applied to the luminescence conversion element as a planarizing layer, and a specular metallic layer which is applied to the dielectric layer.

In a further embodiment in which the luminescence conversion element is provided with the reflector layer, the luminescence conversion element is secured to the heat sink by means of a solder layer. For example, the reflector layer is soldered to the heat sink. In this way, a particularly efficient removal of heat from the luminescence conversion element is achieved.

In a further development of the semiconductor light source, primary radiation which is fed into the luminescence conversion module is reflected at the reflector surface multiple times. Advantageously, in this way a particularly high proportion of primary radiation is absorbed in the luminescence conversion element. In particular, in this way the primary radiation is also distributed over a particularly large region of the luminescence conversion element. The distribution of luminous density of the secondary radiation which is emitted by the luminescence conversion module through its light coupling-out surface is thus advantageously particularly homogeneous.

In one embodiment, the luminescent material of the luminescence conversion element, which may also be a mixture of a plurality of luminescent materials, is contained in the luminescence conversion element in the form of a powder of phosphor particles. For example, the luminescent material is laid down on the reflector surface by electrophoretic deposition. As an alternative, it may also be deposited by a printing method, for example an ink jet, screen printing or stamp printing method. In this way, the luminescence conversion element is advantageously easy to manufacture. In a further development, a fixing layer, for example a layer of silicon oxide, is applied to the luminescence conversion element that contains luminescent material in the form of a powder, and this fixing layer advantageously protects the luminescence conversion element from mechanical damage.

In another embodiment, the luminescence conversion element contains the luminescent material in the form of a single crystal or a polycrystalline ceramic material. The luminescent material for a luminescence conversion element containing a ceramic material is for example given the desired shape when the luminescence conversion element is manufactured, for example by means of a pressing method, and then converted to a ceramic by sintering.

Luminescence conversion elements having a luminescent material which is dispersed in a matrix material such as a silicone or epoxy resin are often insufficiently thermally conductive and are thus only suitable for the present semiconductor light source to a limited extent. The thermal conductivity of the luminescence conversion element is particularly high because of the luminescent material in powder form, the single crystal and/or the luminescent material in the form of a ceramic material, with the result that with these embodiments loss heat is removed particularly efficiently from the luminescence conversion element. Luminescent materials in the form of a single crystal or a ceramic material have a particularly large thermal conductivity.

In an embodiment, the luminescence conversion element is substantially in the form of a planar layer or of a plate, preferably a plane-parallel plate. For example, the surface of the layer or plate has a first main face which forms the light coupling-out surface. In particular, it further has a second main face which lies opposite the first main face and preferably extends parallel to the first main face. Further, the surface of the layer or plate has at least one side face. The side face or the side faces in particular connect the first and second main faces.

The terms "planar layer" or "plane-parallel plate" are understood, in the present context, to mean a layer or plate which—apart from a possible roughening and/or texturing of its surface—extends in rectilinear manner. To put it another way, the planar layer or plane-parallel plate is thus free from any curvature or bend and extends in particular parallel to a plane. In other words, the planar layer or plane-parallel plate has a principal plane of extent to which the first and/or second main face is substantially parallel. The surface of the layer or plate is in this case typically not planar in the mathematical sense—even if it is not deliberately roughened and/or textured—but rather is formed for example from a plurality of particles such that only on average—apart from a possible roughening and/or texturing—a substantially planar or plane-parallel extent of the first and second main faces results.

In one embodiment, the reflector surface or a second partial region of the reflector surface covers the at least one side face in some places or completely.

In another further development, the second main face faces the heat sink. The second main face is for example covered at least in some places by the reflector surface or by the first partial region of the reflector surface. In particular, the reflector surface or the first partial region of the reflector surface is thus arranged between the second main face of the luminescence conversion element and the heat sink.

In one embodiment, primary radiation from the primary radiation source is fed into the luminescence conversion element through the first main face. In this embodiment, the light coupling-out surface of the luminescence conversion element also serves as a light coupling-in surface for the primary radiation.

In a further development of this embodiment, the first main face has a roughening and/or a texturing, for example having projections and/or indentations in the shape of ribs, bumps and/or pyramids. In this way, for example, the feeding in of primary radiation, which impinges on the first main face of the luminescence conversion element at a glancing angle, is improved.

In one embodiment, the semiconductor light source is provided for emitting mixed radiation which comprises or consists of primary radiation emitted by the primary radiation source and secondary radiation emitted by the luminescence conversion module. In this embodiment, good intermixing of the primary radiation and the secondary radiation emitted by the semiconductor light source is achieved by means of the roughened and/or textured first main face.

In another embodiment, primary radiation from the primary radiation source is fed through the side face or at least one of the side faces into the luminescence conversion element. In particular, the primary radiation source in this embodiment is arranged sideways of the luminescence conversion module. In a further development, the side face or surfaces are completely covered by the reflector surface apart from a coupling-in region through which the primary radiation is fed into the luminescence conversion element.

In this embodiment, the risk of electromagnetic radiation which is emitted through the light coupling-out surface being shaded by the primary radiation source and/or by an optical element which feeds the primary radiation into the luminescence conversion element is particularly small. Multiple reflections at the reflector surface are achieved in a particularly simple way in this embodiment.

For example, the coupling-in region is contained in an edge region, preferably in particular a corner region of the luminescence conversion element as seen in a plan view of the first main face. Some of the primary radiation fed into the luminescence module is guided to a further edge region, opposite the edge region—for example a further corner region such as that further corner region which is diagonally opposite the corner region—of the luminescence conversion element, preferably by multiple reflection at the reflector surface. In this way, the edge region, the further edge region and a central region of the luminescence conversion element arranged between these is advantageously illuminated with primary radiation.

For example, as seen in a plan view of its first main face, the luminescence conversion element is in the shape of a rectangle, and a direction of propagation of the primary radiation in the coupling-in region extends, as seen in plan view of the first main face, at an angle β to an edge of the rectangle which angle has a value $0°<β<90°$, preferably $1°≤β≤45°$, for example $5°≤β≤25°$.

Where a ray bundle of the primary radiation is not a parallel ray bundle, the term "direction of propagation" is understood to mean in particular a center axis of the cone of rays in which the primary radiation propagates in the coupling-in region before entering the luminescence conversion element.

Preferably, the angle is selected such that after the first specular reflection at the reflector layer, unscattered primary radiation which is fed into the luminescence conversion element is not reflected back into the coupling-in region.

In a further development of this embodiment, primary radiation is fed into the luminescence conversion module through a wavelength-selective coupling-in reflector. The wavelength-selective coupling-in reflector has a large transmission coefficient for the primary radiation, in particular a large transmission coefficient in the first wavelength range. Further, the coupling-in reflector has a large reflection coefficient for the secondary radiation, in particular a large reflection coefficient in the second wavelength range.

For example, the coupling-in reflector covers the coupling-in region of the side face that the reflector surface leaves free. Advantageously, the wave-selective coupling-in reflector deflects a portion of the secondary radiation that is emitted in the direction of the coupling-in region of the side face such that this portion is emitted at least partially through the light coupling-out surface.

In a further embodiment of the semiconductor light source, the secondary radiation is coupled out of the luminescence conversion module through a wavelength-selective coupling-out reflector. The wavelength-selective coupling-out reflector has a large reflection coefficient for the primary radiation or for a portion of the spectrum of the primary radiation, for example a large reflection coefficient in the first wavelength range. Further, it has a large transmission coefficient for the secondary radiation, that is in particular in the second wavelength range.

Expediently, the wavelength-selective coupling-out reflector is adjacent to the light coupling-out surface of the luminescence conversion element, in particular on the side remote from the second main face. In other words, the coupling-out reflector is downstream of the light coupling-out surface in a direction of emission of the luminescence conversion module. Advantageously, the coupling-out reflector reflects an unconverted portion of the primary radiation back into the luminescence conversion element, as a result of which the conversion is advantageously particularly efficient.

If the coupling out of primary radiation from the semiconductor source is undesirable—for example if the first wavelength range contains ultraviolet radiation—this coupling out may be reduced or completely suppressed using the coupling-out reflector. In a further development, the wavelength-selective coupling-out reflector retains only an undesirable portion of the spectrum of the primary radiation, for example a short-wave portion, and transmits a desirable portion of the spectrum of the primary radiation, for example a portion of longer wavelength.

In a further embodiment, the luminescence conversion module has at least one cooling element, for example a cooling fin, which projects into the luminescence conversion element or through the luminescence conversion element and is thermally conductively connected to the heat sink. For example, the cooling element extends transversely or at a right angle to the first main face, at least through part of the luminescence conversion element. In particular, the cooling element extends in the direction from the second main face to the first. Preferably, it extends from the second main face as far as the first main face or beyond the first main face. By means of the at least one cooling element, the removal of heat from the luminescence conversion element is further improved.

For example, the cooling element adjoins the reflector surface on that side of the luminescence conversion module facing the heat sink. In a further development, as an alternative or in addition the cooling element adjoins a region of the reflector surface which covers the side face or surfaces of the luminescence conversion element.

In an embodiment, the luminescence conversion module has a plurality of cooling fins which are arranged in particular in the manner of a comb. As seen in plan view of the first main face, for example, the cooling fins extend parallel to one another.

In one embodiment, as seen in plan view of the first main face, the luminescence conversion element is in the shape of a rectangle. The luminescence conversion module has for example a plurality of cooling elements which extend parallel to two opposing edges of the rectangle. Each cooling fin adjoins one of the other two edges of the rectangle, and ends at a distance from the second of the other two edges. The arrangement of the cooling elements is preferably selected such that the optical path of unscattered primary radiation in the luminescence conversion element is free from any cooling elements.

The at least one cooling element may as an alternative also be provided for specular or diffuse reflection of primary radiation and/or secondary radiation. For this, in a further development, the cooling element has a surface which is reflective at least at certain locations.

In a further embodiment, the primary radiation is fed into the luminescence conversion module by means of an optical element. For example, the optical element is a reflector such as a plane mirror, a concave mirror or a convex mirror, or a collector lens, a dispersive lens, a light-conducting rod or a glass fiber. It is also possible to provide an optical arrangement having a plurality of such optical elements, for feeding primary radiation into the luminescence conversion element.

In a variant on this embodiment, the wavelength-selective coupling-out reflector, which has a large reflection coefficient for the primary radiation or for a portion of the spectrum of the primary radiation and a large transmission coefficient for the secondary radiation, represents also the optical element. In this variant, the wavelength-selective coupling-out reflector is in particular curved and/or is arranged obliquely with respect to the light coupling-out surface. Advantageously, it is illuminated by the primary radiation source.

The geometrical arrangement of the primary radiation source and the luminescence conversion module, and the curvature and/or the angle between the coupling-out reflector and the light coupling-out surface, are in particular selected such that primary radiation emitted by the primary radiation source is directed, and in particular is deflected, through the light coupling-out surface and into the luminescence conversion element by means of the wavelength-selective coupling-out reflector. Preferably, there is substantially no deflection of the secondary radiation.

For example, the direction of propagation of the primary radiation is approximately parallel to the light coupling-out surface. The wavelength-selective coupling-out reflector is arranged for example at an angle of between 30° and 60°, preferably an angle of approximately 45°, to the light coupling-out surface.

In another further development, the primary radiation source emits primary radiation in a divergent ray bundle, and the light coupling-out reflector is curved such that it makes the divergent ray bundle at least approximately parallel. In this further development, the wavelength-selective coupling-out reflector is in particular in the shape of a concave mirror. Preferably, it is constructed such that the ray bundle which has been made parallel meets the light coupling-out surface at least approximately at a right angle.

In a further development, the wavelength-selective coupling-out reflector, which is also the optical element, may be illuminated by a plurality of primary radiation sources. For example, it has a plurality of segments which are each illuminated by at least one primary radiation source. For example, the wavelength-selective coupling-out reflector is V-shaped in cross-section. As an alternative, it may also be in the shape of a pyramid or truncated pyramid. The tip of the "V" or of the pyramid in particular faces the light coupling-out surface. In the case of the truncated pyramid, in the present context the term "the tip of the pyramid" is understood to mean the tip of that pyramid which completes the truncated pyramid. A center axis of the "V" or of the pyramid/truncated pyramid is for example at a right angle or substantially at a right angle to the light coupling-out surface.

In yet another embodiment of the semiconductor light source, the heat sink embraces the luminescence conversion element. For example, one section of the heat sink faces a side face of the luminescence conversion element. For example, an L-shaped, V-shaped or U-shaped structure of the heat sink—for instance a cut-out—is provided for receiving the luminescence conversion element. Preferably, the luminescence conversion element is at least partly constructed or arranged in a recess of the heat sink.

For example, the reflector surface or at least part of the reflector surface is formed by the surface of the structure or recess or a partial region of the surface of the structure or recess. In a further development, the primary radiation source is arranged in a further recess or in a further L-shaped, V-shaped or U-shaped structure of the heat sink. Advantageously, the removal of heat from luminescence conversion elements is particularly good with this embodiment. Further, a particularly compact design of the semiconductor light source is achieved.

BRIEF DESCRIPTION OF THE DRAWINGS

FIG. 4 shows a schematic plan view of a semiconductor light source according to a fourth exemplary embodiment, FIG. 5 shows a schematic plan view of a semiconductor light source according to a fifth exemplary embodiment, FIG. 6A shows a schematic cross-section through a semiconductor light source according to a sixth exemplary embodiment, FIG. 6B shows a schematic plan view of the semiconductor light source according to the exemplary embodiment in FIG. 6A, FIG. 7 shows a schematic cross-section through a semiconductor light source according to a seventh exemplary embodiment.

DETAILED DESCRIPTION OF THE DRAWINGS

Figure 1:
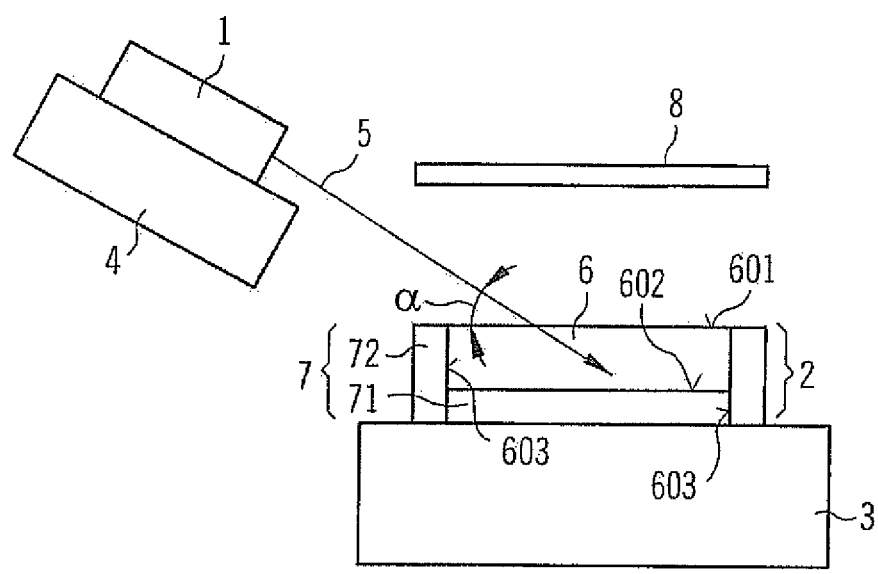
FIG. 1 shows a schematic cross-section through a semiconductor light source according to a first exemplary embodiment.

In the exemplary embodiments and figures, identical or identically acting constituent parts are provided with the same reference numerals. The elements illustrated in the figures and their mutual size ratios should not in principle be regarded as being to scale. For example, individual elements, such as for instance layers, may be illustrated exaggeratedly thick and/or large for better representability and/or better understanding.

FIG. 1 shows, schematically and in cross-section, a first exemplary embodiment of a semiconductor light source. The semiconductor light source has a primary radiation source 1 and a luminescence conversion module 2. The luminescence conversion module 2 is arranged on a heat sink 3. In the first exemplary embodiment, the primary radiation source 1 is arranged on a further heat sink 4.

The primary radiation source 1 is for example a laser diode chip which for example emits primary radiation 5 in a first wavelength range, for example in the blue or ultraviolet spectral range. The radiant power emitted by the laser diode chip is for example greater than or equal to 1 watt.

The luminescence conversion module 2 contains a luminescence conversion element 6 which contains an inorganic luminescent material. By means of the luminescent material, the luminescence conversion element 6 converts primary radiation from the first wavelength range into electromagnetic secondary radiation in a second wavelength range which is different from the first wavelength range. The luminescent material is excited by the primary radiation 5 in particular to create fluorescence and/or phosphorescence.

The luminescent material is selected for example from at least one element of the group comprising garnet luminescent materials such as yttrium aluminium garnet (YAG) that is doped with a rare earth material—for example YAG:Ce—, aluminate luminescent materials, orthosilicate luminescent materials, nitride luminescent material systems—such as nitridosilicates and oxynitrides—alkaline earth sulphide luminescent materials and thiogallate luminescent materials.

For a first wavelength range which includes near UV radiation, luminescent materials based on oxide are for example suitable, for example barium magnesium aluminates doped with europium, such as $BaMgAl_{10}O_{17}:Eu^{2+}$. As an alternative or in addition, also suitable are strontium magnesium aluminates, likewise doped with europium, such as $SrMgAl_{10}O_{17}:Eu^{2+}$, and chlorapatites with strontium, barium or calcium of the formula $(Sr, Ba, Ca)_5(PO_4)_3Cl:Eu^{2+}$. It is also possible to use barium aluminates, such as $Ba_3Al_{28}O_{45}:Eu^{2+}$. All the compounds mentioned emit light in the blue wavelength range when they are pumped in near UV. Luminescent materials that emit green are for example $SrAl_2O_4:Eu^{2+}$. Luminescent materials that emit green to greenish yellow are for example chlorosilicates doped with europium or manganese, such as chlorosilicates of formula $Ca_8Mg(SiO_4)_4Cl_2:Eu^{2+}$ or $Ca_8Mg(SiO_4)_4Cl_2:Mn^{2+}$, and thiogallates of general formula $AGa_2S_4:Eu^{2+}$ or $AGa_2S_4:Ce^{2+}$, where A is in particular selected from the group comprising calcium, strontium, barium, zinc and magnesium. Furthermore, it is possible to use, for example, alkaline earth-substituted strontium sulphides of general formula $(A, Sr)S:Eu^{2+}$, where A=alkaline earth metal ions, as red emitting luminescent materials and converter materials.

Also suitable as a luminescent material which emits in the red spectral range, for example, is a nitride luminescent material system. For example, the nitride luminescent material system is a nitridosilicate such as $M_2Si_5N_8:Eu^{2+}$ with an alkaline earth metal M such as Ba, Ca or Sr. As an alternative or in addition, it is possible to use an aluminium silicon nitride luminescent material which is doped with a rare earth material, such as $MAlSiN_3:SE$, where M in particular represents an alkaline earth metal such as Ba, Sr or Ca, and SE represents a rare earth. In particular, oxynitrides such as $MSi_2O_2N_2:Eu^{2+}$, where M represents for example an alkaline earth metal such as Ba, Ca or Sr, are suitable for the green spectral range.

For the semiconductor light source according to the present exemplary embodiment, and for the other embodiments of the semiconductor light source, orthosilicate luminescent materials such as those of general formula $M_2SiO_4:SE$—where M represents for example an alkaline earth metal such as Mg, Ca, Sr or Ba, and SE represents a rare earth such as europium ($Eu^{2+}$)—are particularly suitable. Orthosilicate luminescent materials are typically particularly efficient. Although there is a high risk with orthosilicate luminescent materials that the emission behavior of the luminescent material will be impaired by fluctuations in temperature, in particular by an increase in temperature, in the case of the semiconductor light source according to the present application this risk is advantageously reduced or eliminated. Orthosilicate luminescent materials convert electromagnetic radiation into the green, yellow and/or yellow/orange spectral range, for example.

In one embodiment, the luminescence conversion element 6 contains a mixture of luminescent materials which contains for example strontium chlorapatite, strontium aluminate and nitridosilicates. For example, it contains 47% by weight of strontium chlorapatite, 48% by weight of strontium aluminate and 5% by weight of nitridosilicates. In an advantageous embodiment, a mixture of luminescent materials of this kind is provided to emit white light, in particular when it is excited by primary radiation 5 having a first wavelength of 405 nm. The white light has for example colour coordinates x=0.354 and y=0.386 in the CIE standard chromaticity diagram.

In the present case, the luminescence conversion element 6 is formed by a plate of the luminescent material which has been sintered to form a ceramic material. As seen in plan view, the plate is in the shape of a rectangle or square. As an alternative, as seen in plan view it may also be in the shape of a polygon, circular surface, elliptical surface or a segment of a circular surface or elliptical surface.

The luminescence conversion module further has a reflector layer 7 which in the present case is composed of two partial regions 71, 72. The first partial region 71 of the reflector layer 7 is arranged between the luminescence conversion element 6 and the heat sink 3. In the present case, it completely covers a second main face 602 of the luminescence conversion element 6. In the present case, the second partial region 72 of the reflector layer 7 completely covers the side faces 603 of the luminescence conversion element 6. The first main face 601 of the luminescence conversion element 6 represents the light coupling-out surface thereof and is not covered by the reflector layer 7. It is opposite the second main face 602, which in the present case faces the heat sink 3. At least the inner surfaces of the reflector layer, which face the luminescence conversion element 6, are constructed to be reflective, in particular to be specular.

In the present case, the reflector layer 7 is a sequence of layers comprising a dielectric layer and a metal layer. The ceramic material of the luminescence conversion element 6 is provided, at least at the side faces 603 and the second main face 602, with the dielectric layer, such as a silicon oxide layer, in particular a silicon dioxide layer, as a planarizing layer, and the metal layer is laid down on the dielectric planarizing layer by vapour deposition. The thickness of the reflector layer is in the present case 50 nm or less. The laminate comprising the luminescence conversion element 6 and the reflector layer 7 is secured to the heat sink 3 for example by means of an adhesive layer or, preferably, by means of a solder layer.

As an alternative, the reflector layer 7 or at least the first partial region 71 of the reflector layer 7 may also be constructed on the heat sink 3, for example the first partial region 71 of the reflector layer 7 being laid down on the heat sink 3 by vapor deposition. This is advantageous in particular in embodiments of the luminescence conversion module 2 in which the luminescence conversion element 6 is for example laid down on the first partial region 71 by electrophoretic deposition or by means of a printing method.

In another embodiment, the second partial region of the reflector layer 7 has at least one reflector plate or at least one reflector strip which in particular comprises a metal and/or is coated such that it is specular. The reflector plate and/or reflector strip is/are joined by adhesion for example to the at least one side face 603, for example by means of a silicone resin.

Primary radiation 5 which is emitted by the primary radiation source 1 is fed into the luminescence conversion element 6 at an angle α to the first main face 601. There, it is at least partly absorbed by the luminescent material, such that the luminescence conversion element 6 emits secondary radiation which is coupled out through the first main face 601.

Secondary radiation, which is not emitted in the direction of the first main face 601 but in the direction of the reflector layer 7 by the luminescence conversion element, is at least partially reflected in the direction of the first main face 601 by the reflector layer 7. Further, in the present case the reflector layer 7 is provided in order, at the first partial region 71 and/or the second partial region 72 of the reflector layer 7, to reflect back into the luminescence conversion element 6 primary radiation 5 which is fed into the luminescence conversion element 6 and is not absorbed by the luminescent material on the path from the first main face 601 to the second main face 602.

Downstream of the first main face 601 is a wavelength-selective coupling-out reflector 8. The coupling-out reflector 8 is spaced from the first main face 601 such that the beam of the primary radiation 5 is guided through the region between the first main face 601 and the coupling-out reflector 8 in order to be fed into the luminescence conversion element 6.

The light coupling-out reflector 8 has a high transmission coefficient for the secondary radiation emitted by the luminescence conversion element 6 and a high reflection coefficient for the primary radiation 5. In this way, primary radiation 5 reflected at the first primary surface 601, for example, is reflected back again in the direction of the luminescence conversion element 6. The wavelength-selective coupling-out reflector 8 is further advantageous if it is undesirable for unconverted primary radiation 5 to come out of the semiconductor light source, for example in the case of a first wavelength range including UV light.

Figure 2:
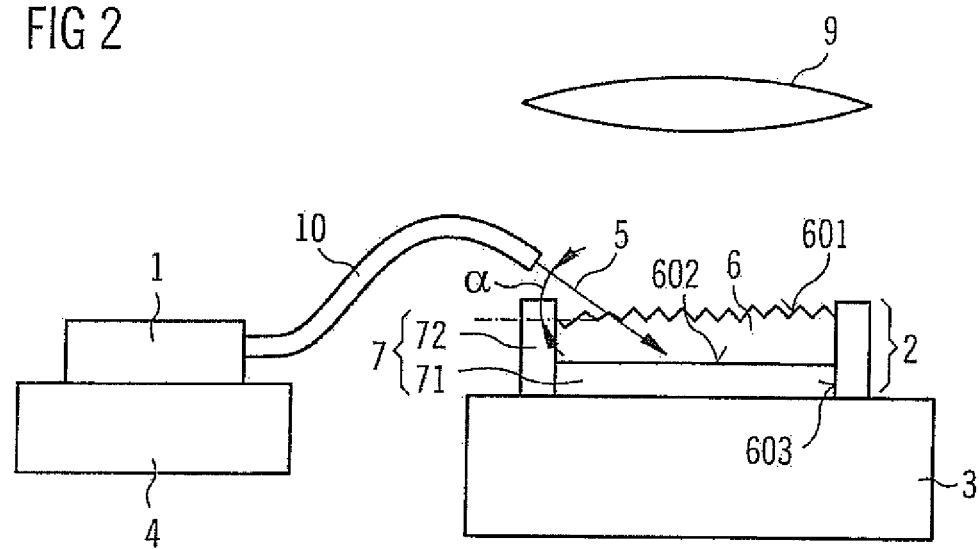
FIG. 2 shows a schematic cross-section through a semiconductor light source according to a second exemplary embodiment.

FIG. 2 shows a schematic cross-section of a semiconductor light source according to a second exemplary embodiment. Unlike the first exemplary embodiment, in the second exemplary embodiment primary radiation from the primary radiation source 1 is fed into the luminescence conversion element 6 by means of an optical element 10. In the present case, the optical element 10 is a light guide such as a glass fibre. By means of the glass fibre 10, the position of the primary radiation source 1 can be selected substantially independently of the coupling-in angle α.

A further difference from the first exemplary embodiment is that in the second exemplary embodiment the first main face 601 is roughened. For example, some of the primary radiation 5 is fed into the luminescence conversion element 6 at the roughened first main face 601, and another portion of the primary radiation 5 is scattered in the direction away from the luminescence conversion element. The semiconductor light source then emits electromagnetic radiation which contains unconverted primary radiation from the primary radiation source 1 and converted secondary radiation from the luminescence conversion module 2.

In the present case, this mixed radiation, or at least the secondary radiation if the coupling out of primary radiation 5 is not desirable, is coupled out through a beam-forming element 9 such as a collector lens, a system of lenses, reflectors and/or light guides.

Figure 3A:
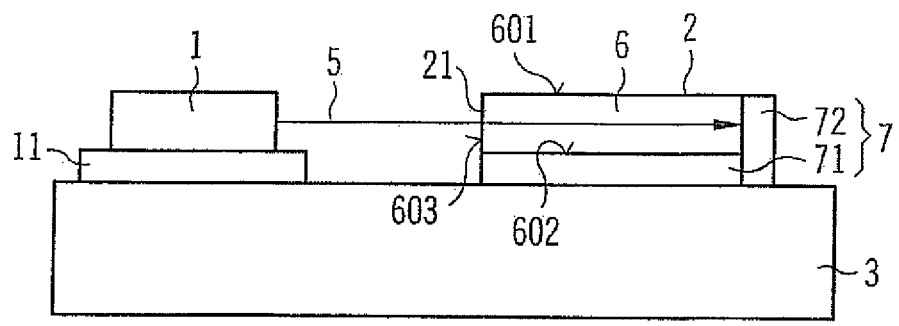
FIG. 3A shows a schematic cross-section through a semiconductor light source according to a third exemplary embodiment.
Figure 3B:
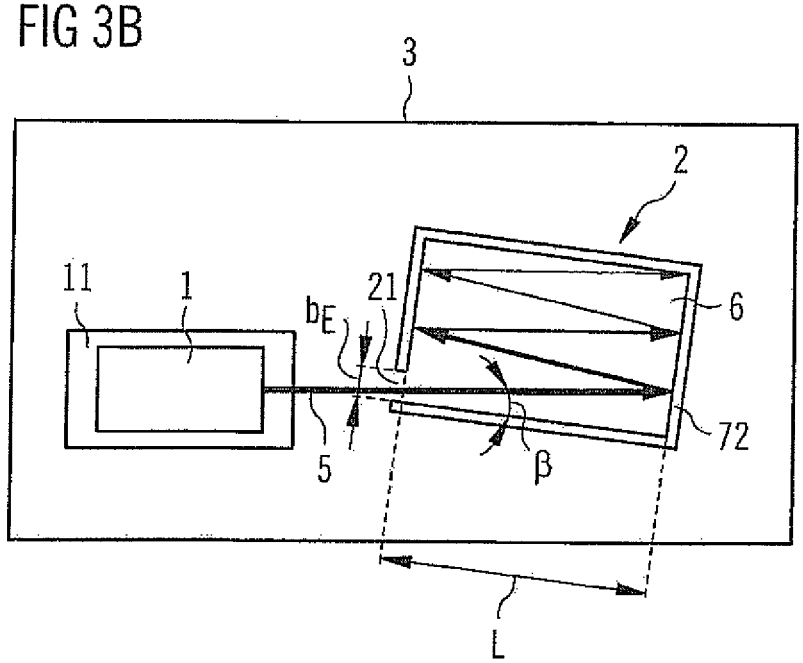
FIG. 3B shows a schematic plan view of the semiconductor light source according to the exemplary embodiment in FIG. 3A.

FIGS. 3A and 3B show a third exemplary embodiment of a semiconductor light source in a schematic cross-section (FIG. 3A) and a schematic plan view (FIG. 3B). Unlike the preceding exemplary embodiments, in the third exemplary embodiment the primary radiation source 1 is not arranged on a separate heat sink 4 but is arranged on the same heat sink 3 as the luminescence conversion module 2.

Further, primary radiation 5 is not fed into the luminescence conversion element 6 through the light coupling-out surface 601 of the luminescence conversion element. Rather, it is fed in through a side face 603 in a coupling-in region 21. The second partial region 72 of the reflector layer 7 completely covers the side faces 603 of the luminescence conversion element 6 apart from the coupling-in region 21. The coupling-in region 21 is arranged in an edge region of the luminescence conversion element 6 as seen in plan view of the light coupling-out surface 601.

The luminescence conversion element 6 is in the shape of a rectangle as seen in plan view of its first main face 601. A direction of propagation of the primary radiation extends, as seen in plan view of the first main face 601, at an angle β to an edge of the rectangle, where in particular:

$0° < \beta < 90°$, preferably $1° \leq \beta \leq 45°$, for example $5° \leq \beta \leq 25°$.

Where a ray bundle of the primary radiation is not a parallel ray bundle, the term "direction of propagation" is understood in the present case to mean a center axis of the cone of rays in which the primary radiation 5 propagates. If the primary radiation 5 extends through an optical element 10 before it is fed into the luminescence conversion module 2, the direction of propagation in the coupling-in region 21 is decisive.

Preferably, the angle β is selected such that unscattered primary radiation 5 which proceeds through the luminescence conversion element 6 after being fed into the coupling-in region 21 is not reflected back into the coupling-in region 21 after the first specular reflection at the second partial region 72 of the reflector layer 7.

If L is the length of the edges of the rectangle that extend at a right angle to the edge belonging to the coupling-in region 21, $B_E$ is the width of the non-specular coupling-in region 21, $n_A$ is the refractive index in the coupling-in region 21 outside the luminescence conversion element 6 and $n_I$ is the refractive index in the luminescence conversion element 6, then the following formula preferably applies to the angle β: $\beta \geq \arcsin[(n_I B_E)/(2 n_A L)]$.

In this way, unscattered primary radiation 5 is fed by means of multiple reflection at the second partial region 72 of the reflector surface 7 in a zigzag motion over a central region of the luminescence conversion element 6 to a further edge region which is opposite the edge region, as indicated by the arrows in FIG. 3B. On each pass through the luminescence conversion element 6, one portion of the primary radiation 5 is absorbed and is wavelength converted to secondary radiation.

By means of the multiple reflection, particularly efficient use can be made of the luminescent material. In particular—for example by comparison with a luminescence conversion element that the primary radiation only passes through once—the quantity of luminescent material required for the conversion is reduced. In this way, particularly cost-effective manufacturing of the semiconductor light source is possible. At the same time, because of the multiple reflection, particularly good spatial homogeneity of the secondary radiation can be achieved.

In the third exemplary embodiment, the primary light source 1 is arranged on a base 11. The base 11 is used to adjust the spacing between the primary light source 1 and the heat sink 3 such that the direction of propagation of the primary radiation 5 is approximately in the center plane of the luminescence conversion element 6. The center plane extends in particular parallel to the first and second main faces 601, 602 and is at the same distance from each of these.

Figure 3C:
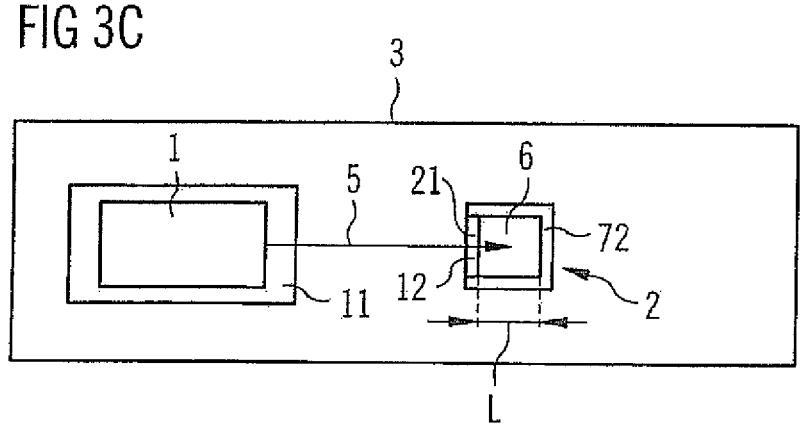
FIG. 3C shows a schematic plan view of a semiconductor light source according to a variant of the third exemplary embodiment.

In the variant of the third exemplary embodiment illustrated in FIG. 3C, the coupling-in region 21 has a wavelength-selective coupling-in reflector 12. The coupling-in reflector 12 has a high transmission coefficient for the first wavelength range—that is, for the primary radiation 5—and a high reflection coefficient for the second wavelength range—that is, for the secondary radiation of the luminescence conversion element 6. By means of the coupling-in reflector 12, a particularly homogeneous luminous density of the luminescence conversion element 6 is achieved.

While in the case of the third exemplary embodiment the dimensions L of the luminescence conversion element 6 as seen in plan view of its first main face 601 are for example greater than or equal to 1 mm, for example between 1 and 50 mm and in particular between 2 and 30 mm, the lateral dimensions of the luminescence conversion element 6 of the variant on the third exemplary embodiment according to FIG. 3C are less than or equal to 0.5 mm, preferably less than or equal to 100 μm, for example being 10 μm or less.

In this variant, in a good approximation, the semiconductor light source represents a point light source, which can be optically imaged in a particularly simple way. Loss heat is particularly effectively removed from the luminescence conversion element 6 by means of the combination of reflector layer 7 and heat sink 3, so that the luminescence conversion module 2 is suitable for feeding in primary radiation 5 of high energy density and the semiconductor light source has a particularly high luminous density.

In particular, primary radiation sources 1 which emit, for example, primary radiation 5 having a radiation density greater than or equal to 0.5 watts and, in a further development, primary radiation 5 having a radiation density greater than or equal to 1 watt, are particularly suitable for the semiconductor light source according to this exemplary embodiment or another embodiment. In particular in the case of a luminescence conversion element having small lateral dimensions, for example of 100 μm or less, and in particular of 10 μm or less, a primary radiation source 1 having a relatively small radiation density—for example greater than or equal to 0.2 W or greater than or equal to 0.1 W—is also well suited for achieving a high luminous density of the semiconductor light source.

FIG. 4 shows a fourth exemplary embodiment of the semiconductor light source. Unlike the semiconductor light source according to the third exemplary embodiment, the luminescence conversion module 2 of the semiconductor light source according to the fourth exemplary embodiment has a wavelength-selective coupling-in reflector 12, for example a distributed Bragg reflector (DBR). The wavelength-selective coupling-in reflector 12 is arranged in the coupling-in region 21, as in the variant on the third exemplary embodiment according to FIG. 3C.

Further, the luminescence conversion module 2 has a plurality of cooling fins 13. The cooling fins 13 extend from the second main face 602 to the first main face 601 over the entire thickness of the luminescence conversion element 6. They are thermally conductively connected to the first partial region 71 of the reflector layer 7.

A first plurality of cooling fins 13 is adjacent to the second partial region 72 of the reflector layer 7, on the side comprising the coupling-in region 21. The other cooling fins 13 are adjacent to the second partial region 72 on the opposite side. In the present case the cooling fins 13 extend parallel to the other two sides of the rectangle that is formed by the luminescence conversion element 6 as seen in plan view. Their length is for example less than or equal to half the length L of these sides.

The first plurality of cooling fins 13 and the other cooling fins 13 are offset from one another such that they oppose one another in the manner of an open zip fastener. The cooling fins 13 are arranged such that the primary radiation which is fed into the luminescence conversion element 6 in the direction of propagation—as it undergoes specular reflection at the lateral partial region 72 of the reflector layer 7—has an optical path that is free of any cooling fins 13, leaving aside scattering and absorption at the luminescence conversion element 6.

FIG. 5 shows a schematic plan view of a semiconductor light source according to a fifth exemplary embodiment. In this exemplary embodiment, the luminescence conversion element 6 is in the shape of a segment of an ellipse as seen in plan view of its first main face 601, in particular in the shape of an elliptical surface that has been halved along one of the principal axes.

In the present case, the primary radiation source 1 contains a plurality of laser diodes 110, for example a laser diode bar. The laser diodes 110 emit primary radiation 5 in divergent ray bundles which are focused by a collector lens 10 and directed to the coupling-in region of the luminescence conversion element 6. The direction of propagation of the primary radiation, that is the center axis of the ray bundle, is indicated by dot-and-dash lines in FIG. 5.

Unlike the third and fourth exemplary embodiments, the coupling-in region 21 has a width $B_E$ that is for example greater than or equal to half the length of that side face 603 into which the primary radiation 5 is fed into the luminescence conversion element 6. The relatively large coupling-in region 21 is advantageously illuminated particularly uniformly by means of the plurality of laser diodes 110 of the primary radiation source 1.

In the case of the sixth exemplary embodiment of the semiconductor light source, which is illustrated schematically in FIGS. 6A and 65 in cross-section (FIG. 6A) and in plan view (FIG. 6B), the heat sink 3 has a recess 31 the inner surface of which forms the reflector surface 7. A bottom face of the recess 31 represents the first partial region 71 of the reflector surface 7, and the side walls of the recess 31 represent the second partial region 72 of the reflector surface 7. The luminescence conversion element 6 is arranged partially or completely in the recess 31. Preferably, it does not project beyond the edge of the recess 31.

The primary radiation source 1 is in the present case arranged in a further recess 32 of the heat sink 3. In this way, the primary radiation source 1 emits primary radiation 5 in a plane that extends through the luminescence conversion element 6.

The recesses 31, 32 are connected to one another by a channel 33 in the heat sink 3 through which primary radiation 5 from the primary radiation source 1 is fed to the luminescence conversion module 2. An optical element, in the present case a light-conducting rod 10, may for example be arranged in the channel 33. The primary radiation 5 is fed to the luminescence conversion element 6 with particularly low loss by means of the light-conducting rod.

FIG. 7 shows a schematic cross-section through a semiconductor light source according to a seventh exemplary embodiment. In the seventh exemplary embodiment, the primary radiation source 1 has a light-emitting diode 110 in a housing 120. The housing 120 of the light-emitting diode component is mounted on the same heat sink 3 as the luminescence conversion module 2.

As in the sixth exemplary embodiment, the primary radiation 5 is fed to the luminescence conversion module 2 by means of a light-conducting rod 10. Unlike the third to sixth exemplary embodiments, the direction of propagation of the primary radiation 5 does not extend through the luminescence conversion element 6, however. Instead, in the present exemplary embodiment primary radiation 5 is fed into a light-conducting plate 10A of the luminescence conversion module 2. The light-conducting plate 10A is arranged between the first main face 601 of the luminescence conversion element 6 and a wavelength-selective coupling-out reflector 8. In the present case, the wavelength-selective coupling-out reflector 8 reflects a short-wave portion, such as an ultraviolet portion, of the primary radiation, for example, and has a high transmission coefficient in the visible range. In particular, the coupling-out reflector 8 transmits a longer-wave portion of the primary radiation 5.

In the present case, the second partial region 72 of the reflector layer 7 extends not only over the side faces of the luminescence conversion element 6 but also over the side faces of the light-conducting plate 10A. In this way, primary radiation 5 is distributed over the entire light-conducting plate 10A or at least over a large region of the light-conducting plate 10A.

The primary radiation 5 is scattered in the light-conducting plate 10A. For example, the light-conducting plate 10A contains diffuser particles for this purpose.

Some of the primary radiation 5 is scattered in the direction of the luminescence conversion element 6, fed into the luminescence conversion element 6 by way of the first main face 601 thereof and has its wavelength converted to secondary radiation of a second wavelength range by the luminescent material. A further portion of the primary radiation 5 is scattered in the direction of the coupling-out reflector 8. In the present case, the semiconductor light source emits mixed light comprising primary radiation 5 and secondary radiation. For example, the portion of primary radiation 5 transmitted by the light coupling-out reflector 8 and the secondary radiation lie in mutually complementary wavelength ranges, such that the semiconductor light source emits light that generates a white color impression.

Figure 8:
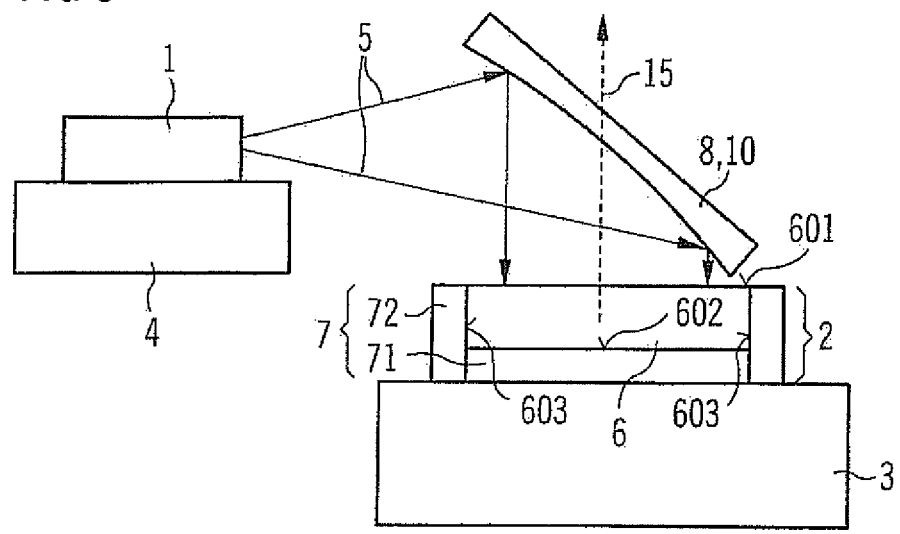
FIG. 8 shows a schematic cross-section through a semiconductor light source according to an eighth exemplary embodiment.

FIG. 8 shows a schematic cross-section through a semiconductor light source according to an eighth exemplary embodiment.

The semiconductor light source contains a luminescence conversion module 2 on a heat sink 3, for example in an embodiment analogous to the first exemplary embodiment.

In contrast to the first exemplary embodiment, the wavelength-selective coupling-out reflector 8 in the present case is not parallel to the light coupling-out surface 601. Rather, the wavelength-selective coupling-out reflector 8 is arranged obliquely with respect to the light coupling-out surface 601. In this way, it deflects primary radiation 5 emitted by the primary radiation source such that the primary radiation at least partially impinges on the light coupling-out surface 601 and is fed through this into the luminescence conversion element 6. The wavelength-selective coupling-out reflector 8 thus at the same time represents an optical element 10 by means of which the primary radiation 5 is fed into the luminescence conversion module 2.

In the present exemplary embodiment, the optical element 10 is constructed as a wavelength-selective concave mirror. The curvature and alignment of the concave mirror 10 are in this case selected such that the divergent primary radiation bundle 5 emitted by the primary radiation source 1 is converted by the concave mirror 10 into a parallel ray bundle impinging on the light coupling-out surface 601 approximately at a right angle. The secondary radiation 15 emitted by the luminescence conversion element 6 is preferably not reflected by the concave mirror.

In the eighth exemplary embodiment, the primary radiation source 1 contains at least one light-emitting diode chip which emits primary radiation 5 in the ultraviolet spectral range.

Figure 9:
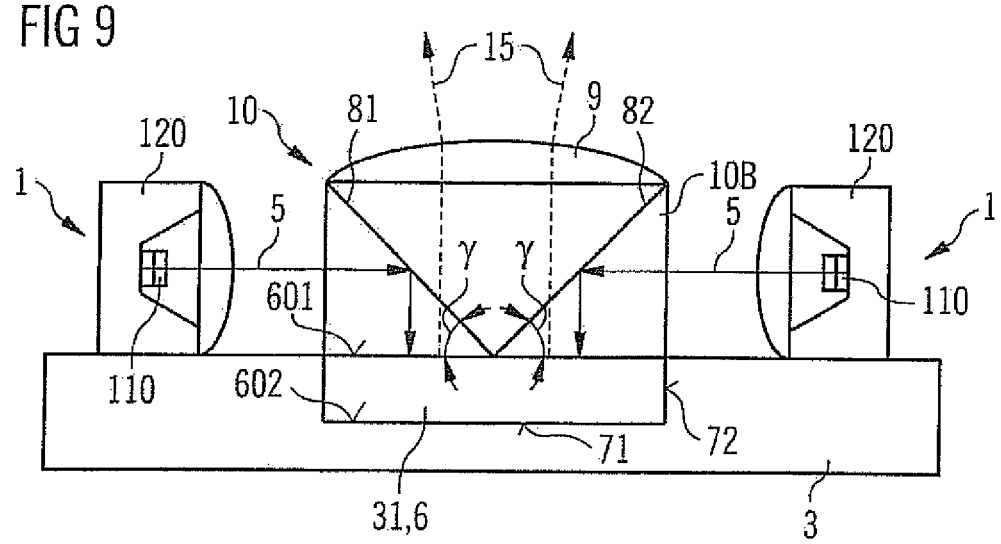
FIG. 9 shows a schematic cross-section through a semiconductor light source according to a ninth exemplary embodiment.

In FIG. 9, a semiconductor light source according to a ninth exemplary embodiment is illustrated in a schematic cross-section.

In this exemplary embodiment, as in the sixth exemplary embodiment (see FIGS. 6A and 6B), the luminescence conversion element 6 is arranged in a recess 31 of the heat sink 3. Contrary to the sixth exemplary embodiment, in the present case the luminescence conversion element is completely surrounded by the sides walls 72 of the recess 31.

In the present case, the semiconductor light source has a plurality of primary radiation sources 1, for example two primary radiation sources 1. These contain for example, as in the eighth exemplary embodiment, in each case at least one light-emitting diode chip 110 which has for example an emission maximum in the ultraviolet spectral range. In the present case the light-emitting diode chips 110 are each contained in a component housing which has an optical arrangement comprising a reflector and a lens for forming a beam. The primary radiation sources 1 are for example secured to a surface of the heat sink 3 which has the recess 31 containing the luminescence conversion element 6.

As in the seventh exemplary embodiment, the direction of propagation of the primary radiation 5 thus does not extend in the direction of the luminescence conversion element 6 at first, but extends offset therefrom. However, associated with each primary radiation source 1 is a segment 81 or 82 of the wavelength-selective coupling-out reflector 8 which—in a manner similar to the preceding exemplary embodiment—at the same time represents an optical element 10 which deflects the primary radiation 5 towards the light coupling-out surface 601 of the luminescence conversion element 6. The segments 81, 82 of the coupling-out reflector 8 are in the present case embedded in an at least partially light-transmitting, preferably transparent positioning element 10B. As an alternative, they may also be constructed, integrally formed on or secured to outer surfaces of the positioning element 10B. The wavelength-selective coupling-out reflector 8 is aligned to the luminescence conversion element 6 in a simple manner by means of the positioning element 10B. In the present case, the positioning element 10B also has a mechanical protection function with respect to the light coupling-out surface 601.

The two segments 81, 82 of the coupling-out reflector 8 meet at a common edge such that the coupling-out reflector 8 has a V-shaped cross-section. The tip of the "V" and hence the common edge of the segments 81, 82 in this case face the light coupling-out surface 601. In the ninth exemplary embodiment, the segments 81, 82 of the optical element 10 are planar surfaces and enclose an angle γ with the light coupling-out surface 601 which in the present case has a value of 45°.

A beam-forming element 9 is for example mounted on the optical element 10 with the wavelength-selective coupling-out reflector 8 and is provided for the purpose of forming the secondary radiation 15 that passes through the segments 81, 82 of the coupling-out reflector 8. In a further development, the beam-forming element may be constructed combined with the optical element.

In a variant of this embodiment, the coupling-out reflector 8 has four segments 81, 82 which for example form the side faces of a pyramid having a square or rectangular base surface. The tip of the pyramid 81, 82 preferably faces the light coupling-out surface 601, and its center axis is preferably at a right angle to the light coupling-out surface 601. In this variant, the semiconductor light source has for example four primary radiation sources 1 which each illuminate one of the segments.

The fact that the invention is described by way of the exemplary embodiments does not restrict it thereto. Rather, it includes any new feature and combination of features, including in particular any combination of features in the exemplary embodiments and claims, even if this feature or combination is not explicitly specified in the claims and/or exemplary embodiments.

The invention claimed is:

1. A semiconductor light source, comprising:
a primary radiation source which, when the semiconductor light source is operated, emits electromagnetic primary radiation; and
a luminescence conversion module into which at least some of the primary radiation is fed;
wherein the luminescence conversion module includes a luminescence conversion element having a reflector layer, which contains at least a partial region of a reflector surface which, by at least one luminescent material comprising one of a single crystal and a polycrystalline ceramic material contained in the luminescence conversion element, converts a wavelength of at least some of the primary radiation that is fed into the luminescence conversion module into secondary radiation;
wherein the luminescence conversion module is arranged on a heat sink at a distance from the primary radiation source; and
wherein a solder layer is arranged between the reflector surface and the heat sink, and the reflector surface at least one of:
reflects back into the luminescence conversion element primary radiation which passes through the luminescence conversion element and which is unabsorbed thereby, and
reflects the secondary radiation in a direction of a light coupling-out surface of the luminescence conversion module.

2. The semiconductor light source according to claim 1, wherein the primary radiation which is fed into the luminescence conversion module is reflected at the reflector surface multiple times.

3. The semiconductor light source according to claim 1, wherein the primary radiation source is arranged on a same heat sink as the luminescence conversion module.

4. The semiconductor light source according to claim 1, wherein the luminescence conversion element comprises a substantially planar layer or a plate whereof the surface has a first main face which forms the light coupling-out surface, a second main face which lies opposite the first main face and faces the heat sink, and at least one side face.

5. The semiconductor light source according to claim 4, wherein the reflector surface covers the at least one side face in some places or completely.

6. The semiconductor light source according to claim 4, wherein the reflector surface covers the second main face at least in places.

7. The semiconductor light source according to claim 4, wherein the primary radiation from the primary radiation source is fed into the luminescence conversion element through the first main face or through the side face.

8. The semiconductor light source according to claim 4, wherein the primary radiation from the primary radiation source is fed into the luminescence conversion element through the side face, and wherein the feeding in is through a wavelength-selective coupling-in reflector which has a large transmission coefficient for the primary radiation and a large reflection coefficient for the secondary radiation.

9. The semiconductor light source according to claim 1, wherein the secondary radiation is coupled out of the luminescence conversion module through a wavelength-selective coupling-out reflector which includes a large reflection coefficient for at least some of the primary radiation and a large transmission coefficient for the secondary radiation.

10. The semiconductor light source according to claim 4, wherein the luminescence conversion module includes at least one cooling element which projects into the luminescence conversion element or through the luminescence conversion element and is thermally conductively connected to the heat sink.

11. The semiconductor light source according to claim 1, wherein the primary radiation is fed into the luminescence conversion module by an optical element.

12. The semiconductor light source according to claim 11, wherein the optical element has a wavelength-selective coupling-out reflector which includes a large reflection coefficient for at least some of the primary radiation and a large transmission coefficient for the secondary radiation, and the secondary radiation is coupled out of the luminescence conversion module through the wavelength-selective coupling-out reflector.

13. The semiconductor light source according to claim 1, wherein the heat sink embraces the luminescence conversion element.

14. The semiconductor light source according to claim 13, wherein the luminescence conversion element is at least partly arranged in a recess in the heat sink, and at least a partial region of the surface of the recess forms the reflector surface or part of the reflector surface.

* * * * *